United States Patent [19]
Mac Lean, Jr. et al.

[11] Patent Number: 5,109,226
[45] Date of Patent: Apr. 28, 1992

[54] PARALLEL PROCESSORS SEQUENTIALLY ENCODING/DECODING COMPACTION MAINTAINING FORMAT COMPATIBILITY

[75] Inventors: Neil H. Mac Lean, Jr.; Mayank R. Patel; Richard A. Ripberger, all of Tucson, Ariz.

[73] Assignee: International Business Machines Corporation, Armonk, N.Y.

[21] Appl. No.: 604,410

[22] Filed: Oct. 29, 1990

Related U.S. Application Data

[63] Continuation of Ser. No. 441,681, Nov. 22, 1989, abandoned.

[51] Int. Cl.⁵ ............................................. H03M 7/30
[52] U.S. Cl. ................................. 341/95; 341/107; 364/260.6; 364/DIG. 1
[58] Field of Search .................. 364/200, 900, 715.02; 375/122; 358/261.1, 261.2; 341/50, 51, 55, 59, 60, 87, 95, 106, 107

[56] References Cited

U.S. PATENT DOCUMENTS

| | | | |
|---|---|---|---|
| 4,467,317 | 8/1984 | Langdon, Jr. et al. | 341/107 |
| 4,626,829 | 12/1986 | Hauck | 341/106 |
| 4,881,075 | 11/1989 | Weng | 341/87 |

FOREIGN PATENT DOCUMENTS

| | | | |
|---|---|---|---|
| 58-103036 | 6/1983 | Japan | 341/106 |
| 63-126326 | 5/1988 | Japan | 341/106 |

OTHER PUBLICATIONS

IBM J. Res. Develop, vol. 23, No. 2, Mar., '79, Arithmetic Coding, J. Rissanen et al.
IBM Technical Disclosure Bulletin, vol. 23, No. 1, Jun. 1980; pp. 310-312, Method for Carry-Over Control in a FIF Arithmetic Code String; G. G. Langdon, Jr.
IBM Technical Disclosure Bullttitn, vol. 23, No. 6, Nov. 1980, pp. 2528-2529, Deblocking Method for Use with Adaptive Arithmetic Encoder/Decoder, G. Langdon, Jr. et al.
Universal Modeling and Coding, J. J. Rissanen, IEEE Transactions on Information Theory, vol. IT-27, No. 1, Jan. '81, pp. 12-23.
Statistics Collection for Compression Coding with Randomizing Feature, IBM TDB, vol. 24, No. 10, Mar. 1982, p. 4917.
A Sample General Binary Source Code, G. G. Langdon, Jr. et al, IEEE Transactions on Information Theory, vol. IT-28, No. 5, Sep. 1982, pp. 800-803.
Control Character Insertion into Arithmetically Encoded Strings, IBM TDB, vol. 25, No. 4, Sep. 1982, pp. 2051-2052.
A Double-Adaptive File Compression Algorithm, G. G. Langdon, Jr., et al, IEEE Transactions on Communications, vol. COM-31, No. 11, Nov. 1983, pp. 1253-1255.
An Introduction to Arithmetic Coding, G.G. Langdon, Jr., IBM Journal Research Development, vol. 28, No. 2, Mar. '84, pp. 135-149.
Overlapped Statistics Memory Access for Decompression, IBM TDB, vol. 27, No. 1B, Jun. 1984, pp. 871-872.

*Primary Examiner*—Howard L. Williams
*Attorney, Agent, or Firm*—James A. Pershon

[57] ABSTRACT

Format compatibility between arithmetic binary compression coding devices used in a magnetic tape drive can be retained even though different numbers of compression/decompression devices are required to attain a higher throughput through the system. Each device must process the data directed to it in a known maximum amount of time. Each compaction processor contains a selected number of statistic tables for each compaction processors. Eight compaction processors are selected with the possibility of two statistic tables in each. Thus format compability can be retained using four compaction processor with two statistic tables in each or double the throughput by using eight compaction processors with one statistic table in each encoder/decoder. Data compacted on a magnetic tape using either speed compaction can be decoded by either tape drive and compatibility is insured.

26 Claims, 8 Drawing Sheets

PARALLEL PROCESSORS SEQUENTIALLY ENCODING/DECODING COMPACTION MAINTAINING FORMAT COMPATIBILITY

This application is a continuation of application Ser. No. 07/441,681, filed Nov. 22, 1989, now abandoned.

CROSS REFERENCE TO RELATED INVENTIONS

Related copending patent applications are Ser. No. 372,744, filed on Jun. 28, 1989, entitled "Combining Small Records Into A Single Block For Recording On A Record Media", Dunn, E. C., et al.; Ser. No. 441,127, filed on Nov. 22, 1985, entitled "Control And Sequencing Of Multiple Parallel Processing Devices", Mac-Lean, N. H., et al.; and Ser. No. 441,126, filed on Nov. 22, 1989, entitled "Data Compression For Recording On A Record Medium", Mac Lean, N. H., et al.

FIELD OF THE INVENTION

The present invention relates generally to arithmetic compression coding of conditional binary sources, and in particular to the format compatibility of arithmetic compression systems for throughput increases.

BACKGROUND OF THE INVENTION

It is often necessary to have a plurality of parallel compaction systems to sustain a required throughput data rate. Each encoder and decoder of the compaction device must process the data directed to it in a known maximum period of time. Since the compaction is done by a plurality of the parallel units, the slowest unit can limit the throughput data rate.

It is, therefore, an object of the present invention to provide a compaction system that can encode and decode the data in a known maximum period of time.

Each compaction unit processes multiple sets of the data, the modifier information obtained from each encoder must be retained across the sets of data. The order of the sets of data must also be kept the same throughout the process. The modifier data is obtained from the statistical tables of the arithmetic coding system. Also, for decoding, the modifier information obtained from each decoder must be retained across the sets of data. The standard method is to solve the modifier retention problem by including one statistics table in one compaction unit so that a specific format is achieved for a given data rate. The throughput data rate is then determined by the number of compression units that are placed in parallel. The larger the number of compression units, the higher the data rate can be since each unit can process a portion of the data. So the throughput required determines the number of parallel compaction units. The number of compaction units determines the format of the compressed data, since the learning curve of the statistic table with each encoder is used to process, i.e., compress, later data. More compaction units formerly added statistic tables and therefore changed the format. Earlier encoded media could no longer be reliably decoded. If a higher data rate is required at a later time, then a new format using more of the compaction units is established. The new format, that the higher number of parallel connected compaction units provides, prevents the decoding of the data that was encoded under the previous format and vice versa. Thus before this invention, the increase in the data rate precluded upward and downward compatibility between the previous system and the improved system.

It is, therefore, another object of the present invention to provide a compaction system through which a higher data rate can be obtained while retaining the same format for all systems.

DESCRIPTION OF THE RELATED ART

The following references show different aspects of the Binary Arithmetic Coding process. This invention uses a modification of the process.

*Arithmetic Coding*, G. G. Langdon, Jr., et al. IBM Journal Research and Development, Volume 23, Number 2, March, 1979, Page 149-162.

*Method for Carry-Over Control in a FIFO Arithmetic Code String*, IBM Technical Disclosure Bulletin, Volume 23, Number 1, June, 1980, Pages 310-312.

*Deblocking Method for Use with an Adaptive Arithmetic Encoder/Decoder*, IBM Technical Disclosure Bulletin, Volume 23, Number 6, November, 1980, Pages 2528-2529.

*Universal Modeling and Coding*, J. J. Rissanen, IEEE Transactions on Information Theory, Volume IT-27, Number 1, January, 1981, Pages 12-23.

*Statistics Collection for Compression Coding with Randomizing Feature*, IBM Technical Disclosure Bulletin, Volume 24, Number 10, March, 1982, Page 4917.

*A Simple General Binary Source Code*, G. G. Langdon, Jr., et al., IEEE Transactions on Information Theory, Volume IT-28, Number 5, September, 1982, Pages 800-803.

*Control Character Insertion into Arithmetically Encoded Strings*, IBM Technical Disclosures Bulletin, Volume 25, Number 4, September, 1982, Pages 2051-2052.

*A Double-Adaptive File Compression Algorithm*, G. G. Langdon, Jr., et al., IEEE Transactions on Communications, Volume COM-31, Number 11, November, 1983, Pages 1253-5.

*An Introduction to Arithmetic Coding*, G. G. Langdon, Jr., IBM Journal Research Developement, Volume 28, Number 2, March, 1984, Pages 135-149.

*Overlapped Statistics Memory Access for Decompression*, IBM Technical Disclosure Bulletin, Volume 27, Number 1B, June, 1984, Pages 871-872.

U.S. Pat. No. 4,467,317, High Speed Arithmetic Compression Coding Using Concurrent Value Updating, G. G. Langdon, Jr., et al.

None of the above references disclose applicants' invention of format compatability of compaction processes between systems having different throughput rates.

It is, therefore, another of object of the present invention to provide an enhanced binary arithmetic encoding process wherein format compatability is maintained in compaction processes using different throughput rates.

SUMMARY OF THE INVENTION

The compaction system of the present invention first partitions the data stream into equal size manageable entities or sets of data. These sets of data are each distributed in turn through a demultiplexer to a plurality of encoders for compression. Each encoder includes a plurality of statistics tables to allow format compatibility with the increased throughput of the binary arithmetic encoders by adding units while reducing the required hardware and providing the expansion to the higher throughput configuration. The compacted sets of data are resequenced in a multiplexer.

To decode the data, the compacted sets are directed to a demultiplexer to distribute each compacted set of data to one of a plurality of decoders. Each decoder also includes a plurality of statistic tables to allow format compatibility with the increased throughput of the plurality of decoders while similarly reducing the required hardware and providing expansion to a higher throughput configuration while providing downward compatibility to the lower throughput configuration. The decompacted sets of data are resequenced through a multiplexer to reassemble the decompacted sets into their original form.

Thus, according to the present invention, multiple compaction processors can be used to sustain a desired data rate while still maintaining format compatibility. Data is first divided into equal sized sets of data for parallel processing by each compaction processor. Each compaction processor contains m number of statistic tables (ST) for n number of compaction processors. The number of sets of data is equal to q and i is the set number, i.e., 0, 1, 2 . . . q−1. Set i is processed by compaction processor CP j, using the statistic table ST j k where:

j = i Modulo n
k = (i divided by n) Modulo m

For an N CP system with M STs in each CP, the possible configuration of a lesser number than v DP system is defined by:

$m \leq M$
$n \leq N$

M, N, m, and n are all integers greater than zero. n is the number of CPs used out of the maximum in an N CP system, and m is the number of STs used out of the M maximum in each CP.

It is, therefore, another object of the present invention to provide an enhanced compaction scheme that permits upward and downward format compatibility of the encoding and decoding process.

The invention of this application partitions the records into manageable entities or sets and processes the data through a compaction system that can be expanded or contracted to process the data stream at a desired maximum variable data rate. The number of encoders and decoders used in the successive transfer of data is dependent on the rate of the data transferred with each successive encoder and decoder handling the compaction and decompaction, respectively, in parallel. The number of encoders and decoders used can expand and contract, depending upon the maximum data rate required. By choosing the appropriate number of encoders and decoders, and how many statistic tables in each, the data format compatibility is maintained.

Yet another object of the present invention, therefore, is to provide a compaction processor that can be adapted to the throughput rate inherent in the data to compress and process the data at the higher rate required by present day record processing systems while providing upward and downward format compatibility that will be able to decode media encoded at both the increased throughput rate and the standard throughput rate.

Adaptive compression is performed in one of two mutually exclusive modes: the run mode which filters out runs of the same character whenever two or more of the same bytes are encountered and the byte mode which serializes data bytes and codes each byte according to its own statistics. Results of both modes are used to collect statistics in a statistic table. The statistics are gathered to establish patterns of bits within the bytes and are stored as the probability of predicting the next bit based on the previous experience. The adaptive compression process maps a string of data bits, using the adaptive data statistics, to a code string in such a way that the original data can be recovered from the code string. The amount of compression is directly proportional to the number of correct bit predictions.

Still another object is to provide a compression scheme that utilizes a plurality of parallel compaction systems and that is adaptable to the data stream while providing a predictable throughput rate together with format compatibility to a compaction system having an increased throughput rate by the addition of parallel compaction units.

Another application of the present invention is for a Lempel-Ziv process that converts variable-length strings of input symbols into fixed-length codes. This process is an adaptive compression process that starts with an empty table of symbol strings, i.e., a dictionary, and builds the table during both the compression and decompression processes. Multiple encoders and decoders may be used to increase the throughput of such a system. For a more complete description of the Lempel-Ziv process, reference is made to the articles "A Universal Algorithm for Sequential Data Compression", J. Ziv, et al., IEEE Transactions on Information Theory, Vol. IT-3, May 1977, pages 337-343; and "Compression of Individual Sequences via Variable-Rate Coding", J. Ziv, et al., *IEEE Transactions on Information Theory*, Vol. IT-24, No. 5, September 1978, page 5306.

The foregoing and other objects, features and advantages of the invention will be apparent from the following more particular description of the preferred embodiment of the invention, as illustrated in the accompanying drawings.

BRIEF DESCRIPTION OF THE DRAWING

The various novel features of this invention, along with the foregoing and other objects, as well as the invention itself both as to its organization and method of operation, may be more fully understood from the following description of illustrated embodiments when read in conjunction of the accompanying drawing, wherein.

DETAILED DESCRIPTION

Figure 1:
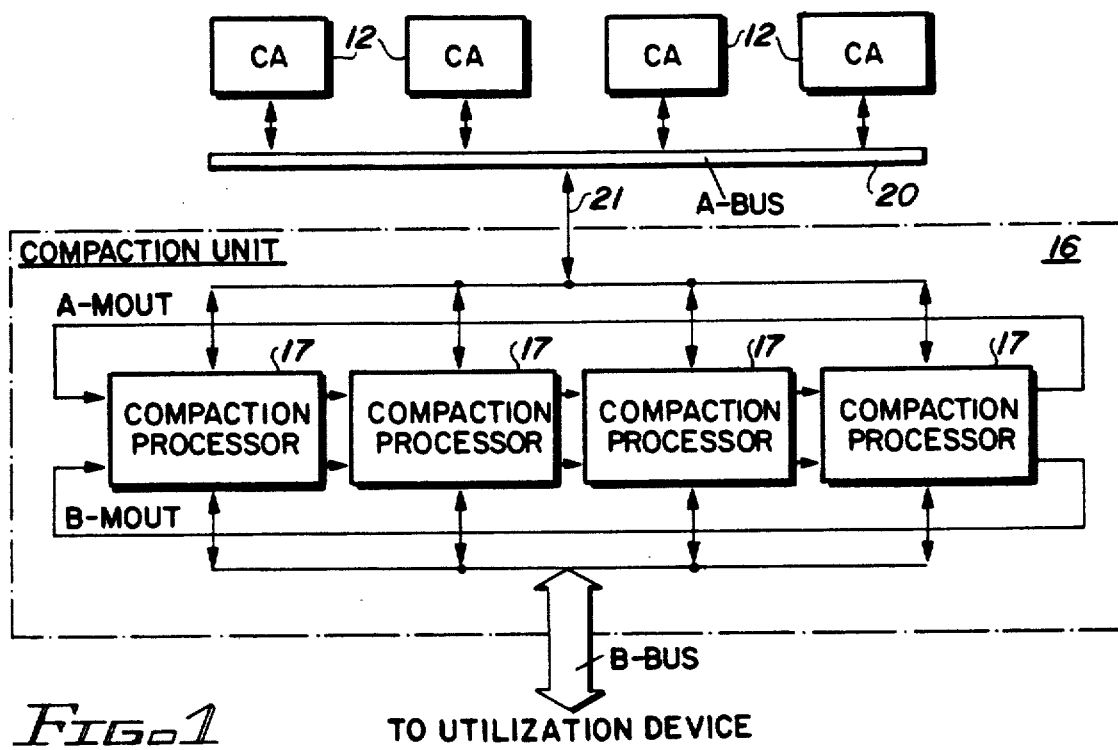
FIG. 1 is a generalized block diagram of a peripheral subsystem with a plurality of parallel connected compaction processors in accordance with the present invention.

The present invention is preferably for use with a magnetic tape system and in particular is for use in the IBM 3490 tape drive. The best mode described herein will, therefore, be for a magnetic tape system, but it should be understood that the invention could be adapted for use in any storage, communication, or transmission system or could be used in any portion of a data processing system where a stream of data is to be compacted for storage for instance, and then retrieved and decompacted for utilization by the data processing system.

The present invention covers an efficient method of compacting most types of information processed data into sufficiently smaller data blocks. The procedure as provided by this invention can be added to the current hardware of an IBM 3480 tape drive. Thereby, the system provides the advancements gained with this invention while continuing to interchange data with the users of the host data processing system when necessary.

Referring more particularly to the drawing, the same reference numerals indicate like structural features and operation in the various figures of the drawing. The compaction unit as shown by the plurality of parallel compaction processors 1-4 of FIG. 1, compacts data during a channel write operation and decompacts data during a channel read operation, when an extended format is selected. Data compaction is performed by using a modified version of the binary arithmetic compaction (BAC) program, explained in the article: *An Introduction to Arithmetic Coding*, by Glenn G. Langdon, Jr., IBM Journal of Research and Development, Volume 28, Number 2, March 1984. Data is encoded by each compaction processor at the rate of 1.25 megabytes per second. Each compaction processor added in parallel permits an addition 1.25 megabytes per second encoding rate, thus increasing the data processing rate. Each additional compaction processor affects the statistics format of the entire compaction system. By this invention, a method will be shown whereby the throughput of the compaction process can be increased by adding compaction processors while the present design accommodates that increase. The increase in the number of compaction processors, while retaining format compatibility with the present embodiment for instance, can be accommodated through the addition of statistical tables to the present embodiment, as will be described later in more detail.

As shown in FIG. 1, a plurality of channel adaptors (CA) 12 are connected to a utilization device such as a tape recording media through a plurality of compaction processors 17 located in a compaction unit 16. The compaction processors 17 each receive the unformatted data from the channel adapters 12 through an A-bus 20. This will be discussed in more detail later. Each compaction processor 17 receives the unformatted data from the channel adaptors 12 via the A-bus 20. The stream of data is directed to the compaction processors 17 where they are separated into identical size blocks or sets of data. The individual sets of data are then directed to individual encoders in each compaction processor 17 for compression of each set in turn by the different encoders. The compacted sets of data are then reassembled and formatted for writing onto the tape media, i.e., the utilization device shown in FIG. 1.

Referring now especially to FIG. 1, the plurality of compaction processors 17 is inserted into the standard read and write flow that interconnects a plurality of channel adapters 12 to interface with the utilization device, for this instance, the read and write format control to and from the recording tape media. The stream of data from a host processing unit is directed to one of the plurality of channel adaptors 12 to interface with the parallel compaction processing devices 17. A channel adapter command set, extended format, directs the data stream transfer through the CA12 interfaces to the A-bus 20, and along a line 21, to the plurality of compaction processors 17. The data stream from the A-bus 20 as directed to all of the compaction processors 17, and it is an A-mout signal that control the receipt and distribution of the data to and from the compaction processors. The procedure will be discussed in more detail for FIGS. 2 and 3. The compaction processors 17, receive the unformatted data from the active CA 12. The compaction processors 17 as a tandem unit shown as a compaction unit 16, separates the unformatted data into identical size blocks or sets of data from the data stream. The individual sets of data are then directed to the individual compaction processor 17 for compaction encoding of each set in turn. The processed sets of data are then reassembled into their original sequence and transmitted to a B-bus for formatting before writing onto the tape media, the utilization device. The more diagrammatic flow diagram of two processing devices and the interconnection of each is shown in FIG. 2.

Figure 2:
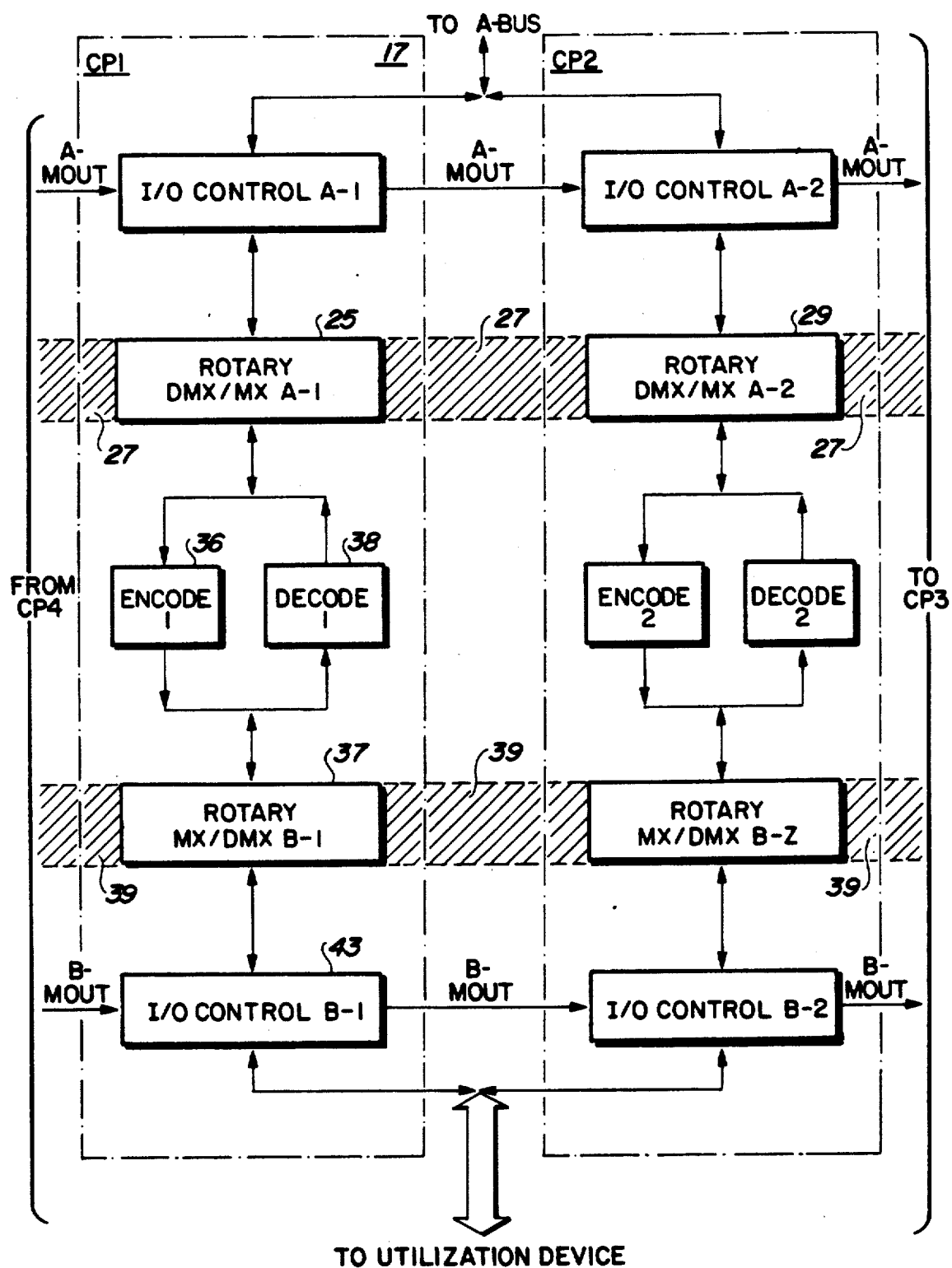
FIG. 2 is a diagrammatic representation of the interconnection of two compaction processors of FIG. 1.

Referring to FIG. 2, the data stream is directed from the A-bus 20 into an input/output control for each of the compaction processors. Compaction processors CP1 and CP2 only are shown on FIG. 2. The data stream in FIG. 2 is directed to I/O control A-1 and I/O control A-2. The I/O control A-1, for instance, determines the set of data that is to be directed to CP 1. The A-mout signal determines which I/O control is active at any particular period of time. Each processing device, PD1 for instance, also includes a section of a rotary demultiplexer/multiplexer device 25, shown as DMX/MXA-1. The dashed and slashed lines 27, connecting the rotary demultiplexer/multiplexer 25, and a rotary demultiplexer/multiplexer 29, of processing device 2 shows that the hardware of all the processing devices are interconnected in order to form one rotary demultiplexer and multiplexer unit that effectively controls the transfer of one set of data into each of the compaction processors. CP1 also includes an encode unit 36 and a decode unit 38. The output of the encode unit 36 and the input to the decode unit 38 is another rotary multiplexer/demultiplexer 37, shown as MX/DMXB-1, that is the resequencing hardware for the encode 36, and the separation hardware for the decode 38. The interconnection of all of the rotary MX/DMX units, such as rotary multiplexer/demultiplexer 37 for CP 1, operates to perform its multiplexer/demultiplexer function, as shown by the dotted and hashed line section 39. The compaction processors 17, operating in parallel as shown in FIG. 1, therefore include an input/output control and a rotary demultiplexer and multiplexer for the top or A section of each of the processing devices and an input/output control and a rotary multiplexer and demultiplexer for the bottom or B section of each of the compaction processors 17.

The data stream from the A-bus 20 is directed to each I/O control of each of the compaction processors 17. The A-mout signal directs which compaction processor is to get its set of data out of the data stream. The rotary demultiplexer and multiplexers distribute the set of data to the encode and decode units within its compaction processor. At initialization for instance, CP 1 gets the first set of data, 512 bytes for the preferred embodiment, then the A-mout signal is activated and CP 2 takes the second set. CP 3 gets the next set and then CP 4 gets its set of data. The next set of data is then transferred to CP 1 to continue the sequence. For the actual hardware included into one compaction processor of FIGS. 1 and 2, reference is made to FIG. 3.

Figure 3:
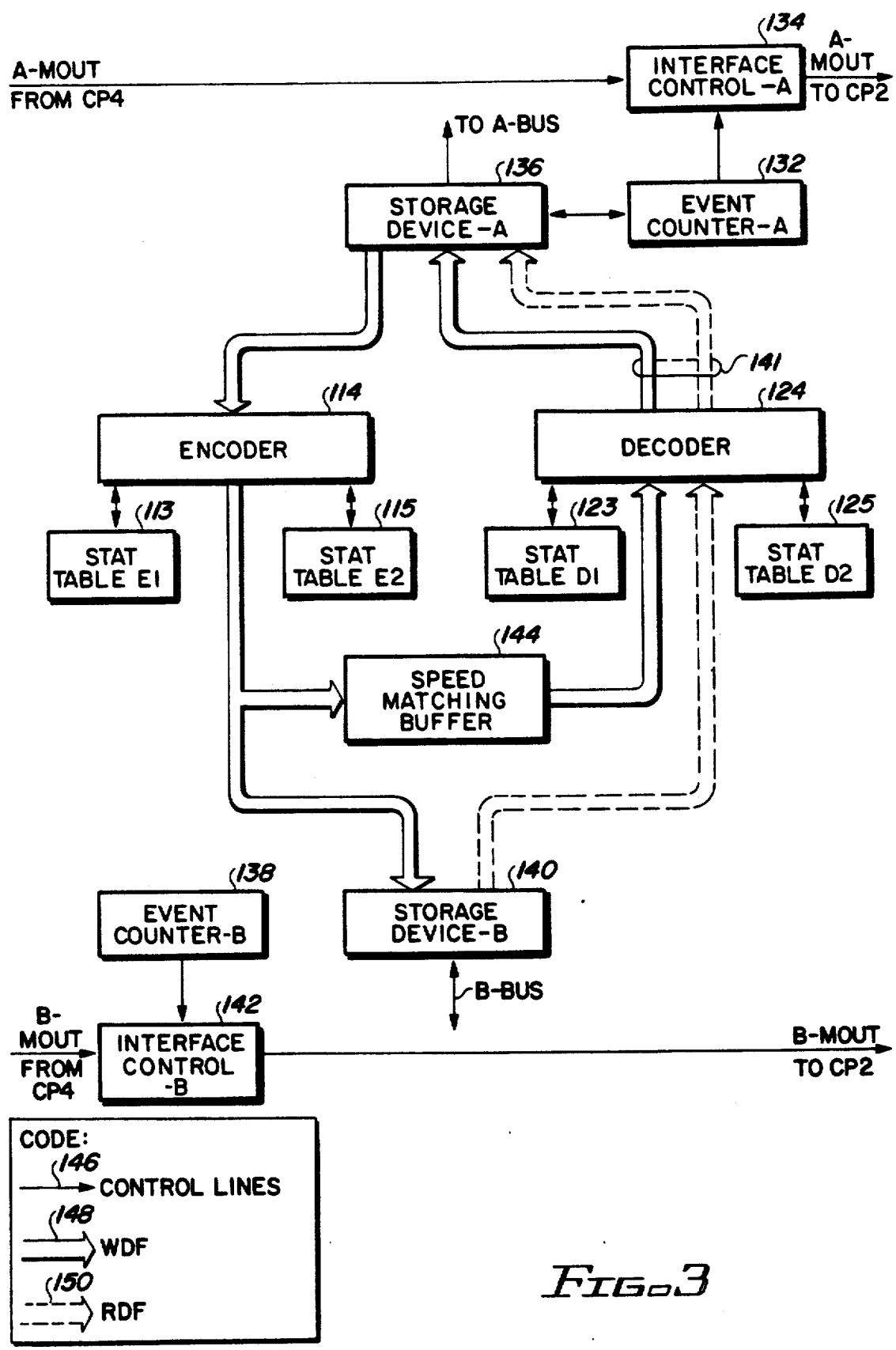
FIG. 3 is a more detailed block diagram of one compaction processor shown in FIG. 1.

As shown in FIG. 3, each compaction processor 17 and in particular CP1, includes an event counter 132, an interface control 134, and a storage device 136. These devices are unique to the top or A section of CP1. The bottom or B section of the CP1 also includes an event counter 138, a storage device 140, and an interface control 142. The CP1 also includes one encoder 114, one decoder 124, and a speed matching buffer 144. The event counters such as 132 and 138 are used in each of the processing devices for the upper and lower interfaces to control and verify the splitting and merging of the respective data sets into and out of the processing devices. The encoder 114 includes two statistics tables 113 and 115. The decoder 124 also includes two statistics tables 123 and 125.

Continuing with FIG. 3, it will be assumed that CP1 is activated which could be either through the initialization process or the transfer of control from the previous processing device, i.e., CP4. As stated previously, the signal A-mout transfers the control from one CP unit to the next. On the write cycle, which is when the data stream from the host is compacted and written onto the tape media, the stream of data is directed to all storage devices in the A section of the compaction processor. The storage device 136 signals the event counter 132, that one set of data has been received, i.e., 512 bytes. The event counter 132, in turn, signals the interface control 134 unit that CP1 has received its section of data, i.e., one set, and the next set of data should be received by CP2. On the write cycle, the set of data is transmitted using the solid line shown in FIG. 3. The code for the different lines shown in FIG. 3 are a solid single line 146 that signifies the control lines controlling the different hardware of the compaction processors, the solid double line 148 signifies the write data flow (WDF). The signal transfers in the dashed dual line code 150 signifies the read data flow (RDF) signal flow through CP1.

The set of data is transmitted from the storage device 136 to the encoder 114 for compaction of the set of data. The encoder 114 uses the statistic tables 113 and 115 to compact the set of data. After the compaction process is completed, encoder 114 transmits the compacted data set to the speed matching buffer 144 and the storage device B140. The compacted data is transmitted to the speed matching buffer 144 for storage in order to match the output of the encoder 114 with that of the decoder 124. The just-compacted data is transmitted from the speed matching buffer 144 to the decoder 124 for decompaction. The decoder 124 transfers the decompacted data back to the storage device 136 for checking. The compacted data is transferred to the storage device 140 where it will await the control by the event counter 138 and the interface control 142 to signal that the compressed set of data can be placed onto the B-bus for transfer to the tape media.

On the read or retrieve data cycle to retrieve data from the tape media, the compacted sets of data are received from the tape media and transmitted to the storage device 140. The compacted bits of data information are stored within the storage device B140 until the entire compacted set of data is received. At that time, a delineation signal separating the compacted sets of data activates the event counter 138 which in turn activates the interface control 142 to transfer control on the B-mout signal line to the next processing device, CP2. CP2 can receive its set of data for use within its compaction process. Continuing on the RDF signal path, the stored compacted set of data is transferred to the decoder 124 where it is decompacted and transmitted to storage device 136 on line 141 for storage until the storage device signals that it has received its 512 byte set of data and control is given to the interface control unit 134 such that the storage device 136 can transmit the set of data onto the A-bus 20 to the channel adapters 12. After the decompacted data is transferred, the event counter 132 signals the interface controller 134 to transfer control via the A-mout signal line to the CP2. This is done such that the next set of data can be transferred from the storage device A of the CP2 onto the A-bus and eventually to the channel adapter. Reference is made to the copending patent application Ser. No. 441,127, filed on Nov. 22, 1989 and entitled "Control and Sequencing of Multiple Parallel Processing Devices", MacLean, et al., for a more complete description of the control and sequencing of the compaction processors 1-4.

Further description of the processing of the data on a tape media system is described in the Milligan, et al., U.S. Pat. No. 4,435,762, assigned to the assignee of the present invention.

A single compaction processor is not fast enough to compact a data stream and maintain a given data rate for the uncompressed data. The speed increase in the present invention is roughly linear with the increase in the number of data compression units. The written data on the media can be similarly decompressed at high speed using the same number of units as was employed for the compression. Each of the sets of 512 byte blocks are independently compressed in a separate compaction processor. Thus the first data set goes to compaction processor 1, the second to compression processor 2, and so on, until the fourth set of data is compressed by the compression processor 4. The fifth rotates back to CP1.

Figure 4:
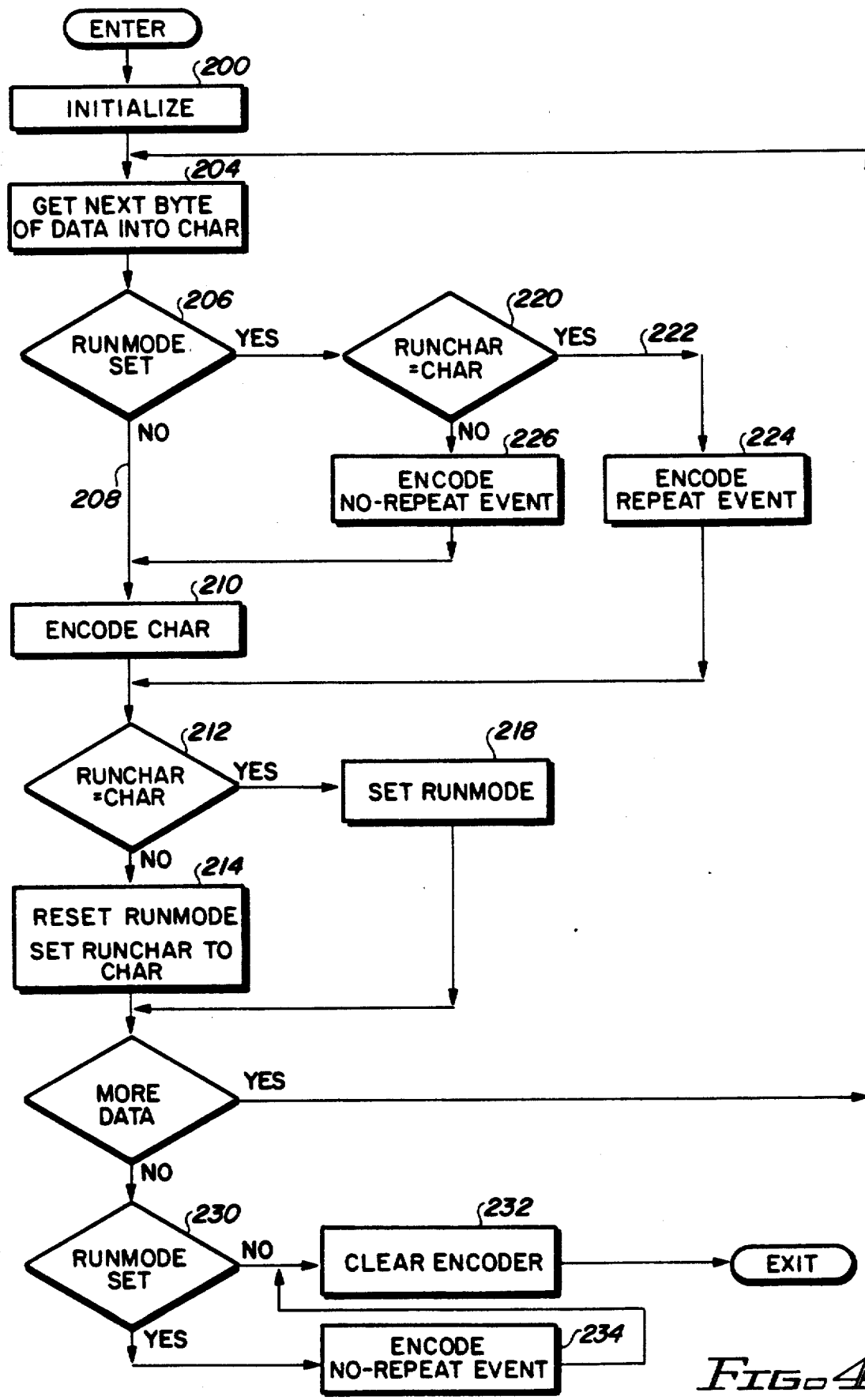

Referring to FIG. 3, there is a time-critical feedback path in decoding binary information with a binary arithmetic code which involves accessing a statistic table for the next bit based on the value of the last bit. If not circumvented, this problem will slow down the cycle time required to decode each bit. A look ahead technique, reading out more than one statistic from adjacent locations, and selecting the correct statistic table, is combined with accessing different levels of a tree for each successive bit and reading out the possible statistics for two levels at the same time. The process flow chart for the encoding scheme is shown in FIG. 4 and will be discussed later.

The binary arithmetic code program for the compaction of data requires binary statistics in order to achieve compression. This entails the fetching of a statistic for each encoded or decoded bit. The statistics are stored in a linearlized tree. The requirement for coding a bit is to access each level of the tree only once every eight bits encoded. Since once a statistic is used, then not used again for 8 bit cycles, prefetching or looking ahead to overlap the accessing of skews with the encoding or decoding of bits is employed. The statistics table E-1 113, handles the first or modulo zero data set while the statistics tables E-2 115, handles the modulo 4 packet of data out of the modulo 8 packets directed to the compression unit.

FIG. 3 shows the two statistic table units 123 and 125, for the decoder 124. The statistics tables 123, and statistics table 125 are shown connected to the decoder unit 124, of FIG. 3 and essentially operate in the same manner as described for the statistic tables 113 and 115 for the encoder 114. The random access memory of all of the statistic tables for both the encoder and decoder looks like eight encoders and decoders are on line when four are actually in the preferred embodiment. This doubling of the statistic tables for each encoder and decoder accomplishes a format compatibility with eight encoders and decoders with one statistic table in each. The eight encoders and decoders would double the throughput of the four shown in FIG. 1, while the use of one statistic table for each encoder and decoder would permit format compatibility with the four encoders and decoders and two statistic tables each of this preferred embodiment.

Thus, according to the present invention, multiple compaction processors can be used to sustain a desired data rate while still maintaining format compatibility. Data is first divided into equal sized sets of data for parallel processing by each compaction processor. Each compaction processor contains m number of statistic tables (ST) for n number of compaction processors. The number of sets of data is equal to q and i is the set number, i.e., 0, 1, 2 . . . q−1. Set i is processed by compaction processor CP j, using the statistic table ST j k where:

j = i Modulo n
k = (i divided by n) Modulo m

For an N CP system with M STs in each CP, the possible configuration of a lesser than N number of CPs in a data processing system is defined by:

$m \leq M$
$n \leq N$

M, N, m, and n are all integers greater than zero. n is the number of CPs used out of the maximum in an N CP system, and m is the number of STs used out of the M maximum in each CP.

For the preferred embodiment shown, N is equal to eight CPs and M is equal to two STs in each CP. The possible configurations are where n is equal to four and m is equal to two. An increase in throughput is possible by using eight CPs and one ST in each, i.e., n is equal to eight and m is equal to 1. Other possibilities for eight CPs, i.e., N is equal to eight, is where M is equal to eight, then the possible configurations are:

n = 8, m = 1
n = 4, m = 2
n = 2, m = 4
n = 1, m = 8

For eight CPs and where M is equal to four, then the possible configurations are:

n = 8, m = 1
n = 4, m = 2
n = 2, m = 4

Thus, format compatibility can be maintained through increases in data throughput by selection of the throughput rate required now, and the throughput rate desired later, while maintaining format compatibility through all of the throughput rate increases. Downward and upward compatibility for higher and lower throughout rate compaction is assured.

The adaptive compaction is performed for each byte in the encoder in one of two mutually exclusive modes. The first is the byte mode which compresses sequential repetitions of the same character when one or more repetitions are detected. These are identified by setting the run mode sequence. The second mode is the byte mode which codes individual bytes according to statistics which have been accumulated. The byte mode is used when the previous two bytes are different or after a byte mode indicates a non-repetition. This mode is identified when the run character equals the character. The results of both modes are used to accumulate the statistics from the statistics tables depending upon which statistic table is activated at that time. The coding program adapts to the statistics for each byte of data. For RUN mode processing, the statistic is based on the likelihood of a byte repetition. For byte mode processing, initially, each bit of each byte is assumed equally probable. The statistics are updated on a bit basis and stored in a binary tree structure in the statistics table. The statistics are reset prior to receiving each record for the input data string. Consequently, each record is processed independently. As will be discussed for FIG. 4, the program dynamically determines which mode is in effect with the objective of maximizing data compression. The program maps a string of data bits, using adaptive data statistics, to a code string in such a way that the exact original data can be recovered form the code string. The amount of compression is in direct proportion to both the number of successive byte repetitions and the preponderance of popular byte values. The encode and decode units both use the same number of statistic tables which can be selected for the maximum number of parallel compaction processor units required to meet the system maximum data rate. For a further discussion of the compaction processing according to FIGS. 4-15, reference is made to the article *Arithmetic Coding* by G. G. Langdon, Jr. and J. J. Rissanen, IBM Journal of Research and Development, Volume 23, Number 2, March 1979, and to the previously mentioned article *An Introduction to Arithmetic Coding* and to the U.S. Pat. No. 4,467,317, issued August, 1984, entitled, High Speed Arithmetic Compression Coding Using Concurrent Value Updating. These publications and the U.S. patent will give a much more complete description of the encoding and decoding process according to the present invention wherein a single statistics table is used for each encoder and decoder unit.

Referring to the compaction encode process flow diagram of FIG. 4, the run mode sequence is when two previous bytes are the same. The byte mode is the mode used when the run mode is not found. The run mode compresses sequential repetitions of the same character when one or more repetitions are detected. When the run mode is not found, that is when the byte mode is entered, the individual bytes are coded according to the statistics which have been accumulated and is used when the previous two bytes are different, i.e., the run mode is not found or after a run mode indicates a non-repetition. The results of both modes are used to accumulate the statistics. The coding process adapts to the statistics for each byte. For run mode processing, the statistic is based on the likelihood of a byte repetition. For bit mode or not run mode, initially each bit of each byte is assumed equally probable. The statistics are updated on a bit basis and stored in a binary tree data structure. The statistic takes the form of a three bit field where one bit indicates which bit value is more likely, and the other two bits are a number having values having from one to four. The value gives a relative probability of the bit value occurring that is most likely, the value one indicating one equally likely and the value four most likely. The statistics are reset at the beginning of each logical block received form the host, and consequently, each logical block is processed independently. The process dynamically determines which mode is in effect with the objective of maximizing data compression. The process maps a string of data bits, using the adaptive data statistics, to a code string in such a way that the exact original data can be recovered from the code string. The amount of compression is directly proportional to the number of successive byte repetition and the preponderance of popular byte values.

Figure 6:
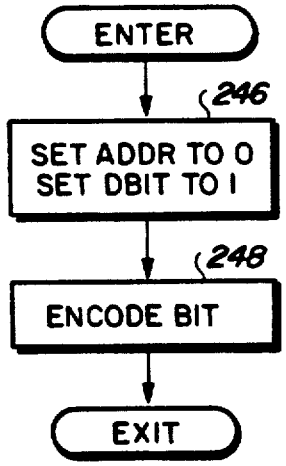
FIGS. 4 to 8 show flow charts of different procedures performed by the encoder of FIG. 3.
Figure 7:
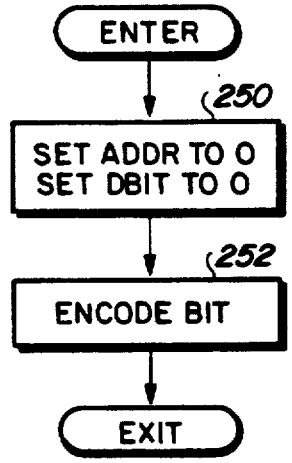
Figure 5:
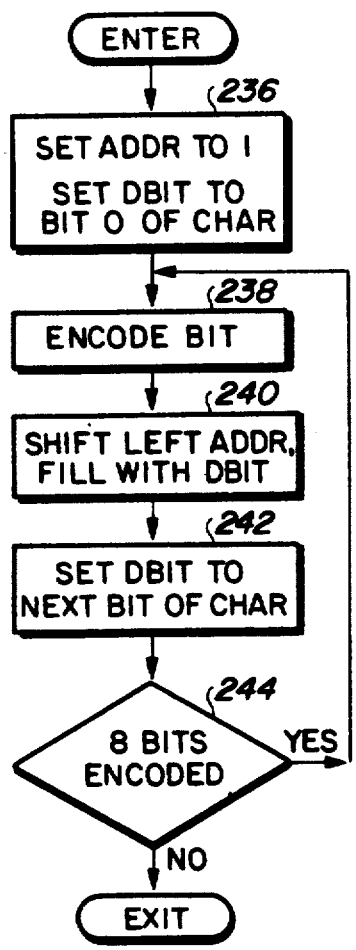

The flow chart of FIG. 4 shows the overall encode process for a set of data. As stated, the set of data is 512 bytes except for the last set which is the remainder bytes left over after the separation of the stream of data into the sets of data. For each set of data, the encoder is initialized to a known state. The statistic tables are not initialized for each set of data, rather they are initialized only for each channel record. The RUNCHAR register is initialized. The RUNMODE register is reset at the beginning of each set of data. Each byte of the set is fetched and loaded in the CHAR register. If the RUN mode is set then the RUNCHAR and the CHAR registers are compared. If they are equal, then an encode repeat event, shown in FIG. 6, is executed. Otherwise, an encode no-repeat event, shown in FIG. 7, is executed and the encode CHAR process, shown in FIG. 5, is executed. If the RUN mode was not set, then the encode CHAR process is entered directly.

Now that a byte of the set has been encoded in the RUN mode, the RUN mode determination has been made. The RUNCHAR and CHAR register are compared. If they are equal, the RUN mode is set. Otherwise, the RUN mode is reset and the RUNCHAR register is set to the CHAR register information for the next RUN mode event.

The process is repeated until all bytes of the set of data are processed. The encode no-repeat event is executed to end the set of data processing in the run mode. Whether RUN mode is set or reset, the contents of the code register in the encoder are shifted out as part of the code.

Figure 11:
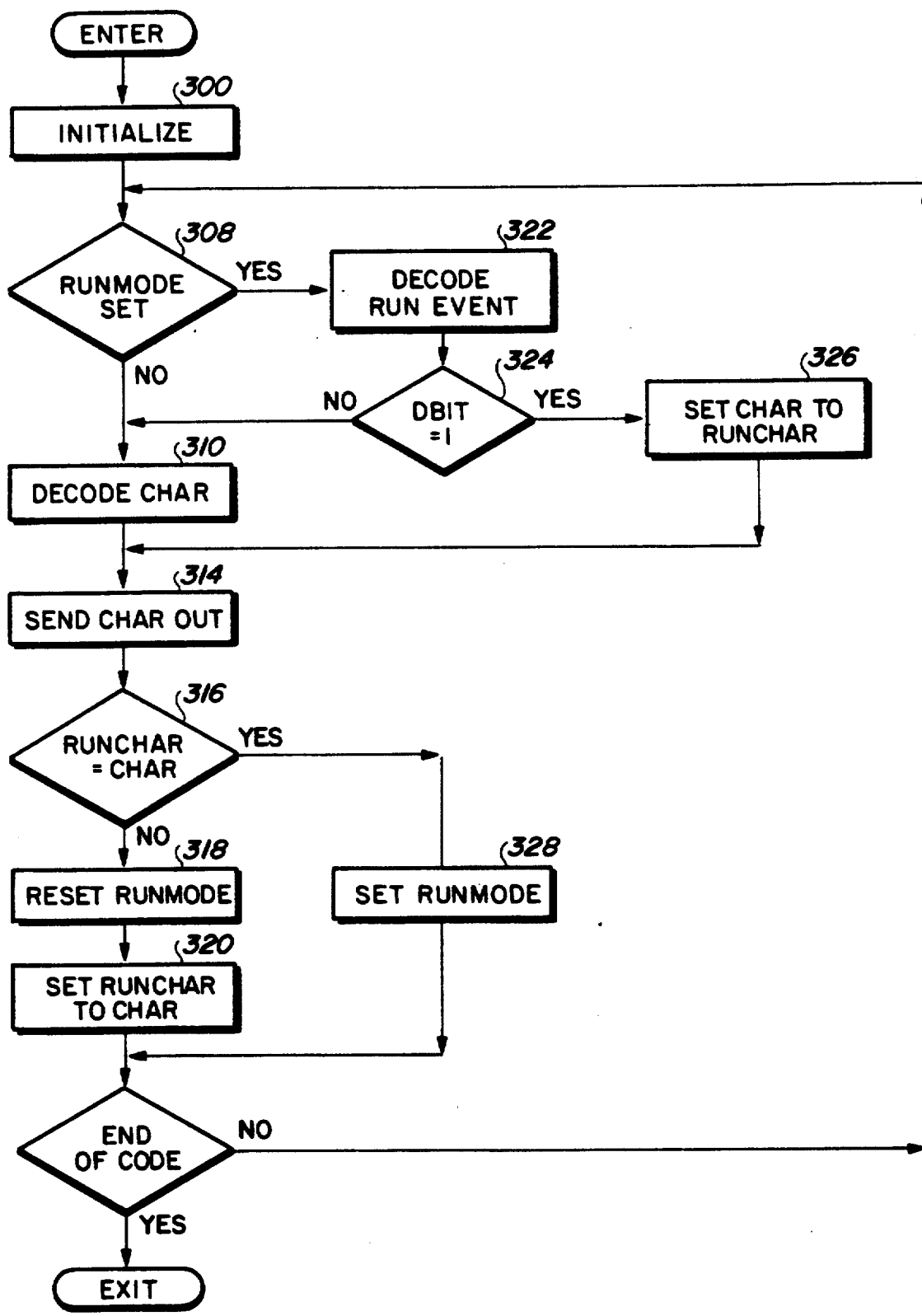

The flow diagram of FIG. 4 starts in block 200, by initializing or resetting the different registers to start the program. A next step in block 204, is to get the next byte from the set of data and place it into the CHAR register. The decision block 206, is whether the run mode sequence has been set. If not, a "no" line 208, is taken to the next step in block 210, where this byte is encoded. The process continues in a block 212, to check whether the character is the same as the previous character. If not, the NO line is taken to reset the run mode in a block 214, and to set the RUNCHAR register equal to the CHAR register, also shown in block 214. The process continues to get the next byte, block 204. If the run mode, block 206, has been set, the YES line is taken to go to the next decision block 220, to check to see whether the information in the RUNCHAR register is the same as the CHAR register. If it is, a yes line 222 is taken to encode the repeated event in a block 224, and to again proceed down the process chart where the character is checked to see if it is equal to the last character, block 212, and since it is, the run mode is continued to be set in block 218, and to return to the beginning of the sequence to get more data. The RUN mode sequence is used if the previous bytes are the same and the encode unit compacts this similar data according to the binary arithmetic coding process. If the character of this byte is not the same and therefore the NO line is taken from block 220, the no-repeat event is encoded in a block 226, and the flow continues to encode the character in block 210. Since the RUNCHAR register is not equal to the CHAR register, the NO decision line from block 212 is taken to reset the run mode in block 214. The process then continues in the same mode to check each byte since the RUN mode character is not set and at this time it is the bit mode where the bits of each of the byte are processed to compact the non-similar bits of this byte. The process continues to check for all of the bytes in the set of data to be encoded. The decode process to decode the information just encoded is shown in FIG. 11. The process flow for some of the separate blocks of FIG. 4 is shown is FIGS. 5-8.

FIG. 5 shows the ENCODE CHAR procedure of block 210 of FIG. 4. When the bytes are not repeated, in the non-run mode, each byte is encoded by the encode character of block 210, shown in FIG. 4. For each of the eight bits of the byte stored in the character CHAR buffer, statistics are fetched, then encoded by the encode procedure shown in FIG. 8. The updated statistics are then stored back into statistics table. To encode a byte, a DBIT register is set first to the most significant bit of the byte. The address at which the statistics are fetched for the first bit, ADDR, is set to 1, as shown in block 236. The bit is encoded, block 238, using the ADDR address and the encode bit process shown in FIG. 8. For encoding the next most significant bit, the new statistics table address is generated by shifting the ADDR address, as shown in block 240, left one bit and filling with the DBIT. As shown in block 242, the DBIT is set to the next most significant bit of the CHAR register. The above process is repeated eight times, as shown in block 244, to encode all of the bits of the character.

The encode repeat event of block 224, of FIG. 4, is shown in FIG. 6. Address zero of the statistic tables is used for the run mode. The address ADDR is set to zero and the DBIT character is set to one, as shown in block 246, to indicate that a repeated bit is to be encoded, when the run mode is set. The encode bit process of FIG. 8 is then execute to encode the repeat event, as shown in block 248.

The encode non-repeat event of block 226, of FIG. 4, is shown in FIG. 7. The first step is shown in block 250, to set the address ADDR of the statistic tables to zero and to set the DBIT character to zero, to indicate that a bit that is not equal to the run character is to be encoded when the run mode is set. Address zero of the statistic tables is used for the run mode. Then the encode bit process of FIG. 8 is executed, as shown in block 252, to show that a break in the run mode has happened and that the non-run character is encoded in the encode character block 210, as shown in FIG. 4.

Figure 8:
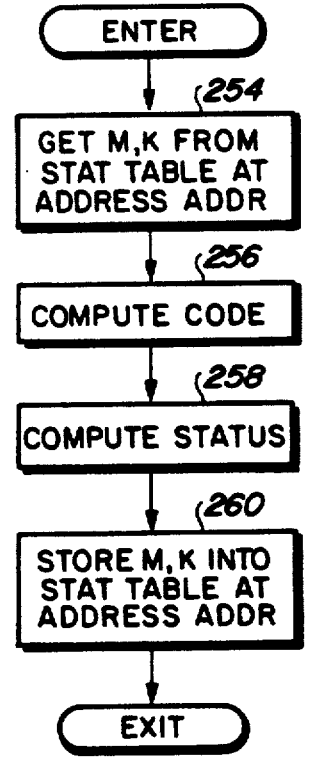
Figure 9:
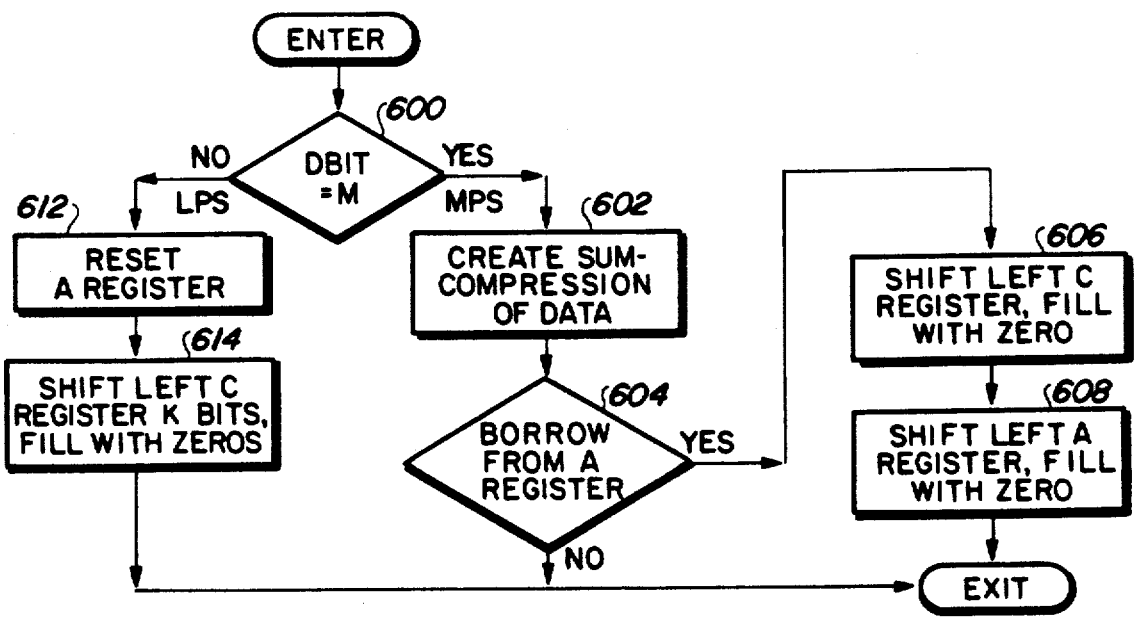
FIG. 9 shows the flow of the encoding process that generates a sum of the probabilities as an output of the encoder shown in FIG. 3.

The encode bit process of FIG. 8 is used in the block 238 of FIG. 5, the encode bit block 248 of FIG. 6 and the encode bit block 252 of FIG. 7. In the first step of the process, block 254, the statistics M and K are fetched from the statistic tables at the address specified by the address ADDR. The M statistics is a one bit value indicating the guessed value and the statistic K is a two bit probability value. K can be a number from one to four. M, K, and DBIT are used to encode the bit using the process in the compute code block 256. The compute code process is shown in FIG. 9. Next as shown in block 258, the statistics are updated to adapt to the data. This is done in the compute STATS process shown in FIG. 10. After the new statistics are computed in M and K, the statistics values are stored into the statistic tables at the address specified by the address ADDR, as shown in block 260.

As shown in FIG. 9 for the compute code process, the encoding process generates a sum of the probability. The sum is the code, which is the output of the encoder. The sum is generated by adding and shifting operations on a sum register C. Also, a normalization register is used, register A. In the preferred embodiment, both the A and C registers have four bits each. In the initialization step of FIG. 4, both A and C registers are initialized to zero. The first step in the compute code process of FIG. 9 determines whether a most probable symbol MPS, or a least probable symbol LPS, is to be encoded, as shown in block 600. If the DBIT is equal to the guessed value M, then an MPS is to be encoded. Otherwise, an LPS is to be encoded and the LPS, line 526, is taken. The A register is reset to zero and the C register is shifted left K time. The C register is filled with zeros when shifted left K times. The bits coming out of the C register by the shift process, are concatenated into a string of bits. The compacted data is this string of bits coming out of the C register, with additional operations performed on this string.

For a most probable symbol (MPS) a probability factor is generated from K, denoted by PF. The PF is four bit value that is used to perform arithmetic operations on the A and C registers. If K is 1, the PF is set to 1000. If K is 2, then PF is set to 0100. If K is equal to 3, then PF is set to 0010. If K is equal to 4, the table in PF is set to 0001. The PF value is added to the contents of the C register. If there is a carry out of the C register, then the carry out is propagated through the previous code bits that were generated. The new four bit sum is stored back in the C register. Further, the PF is subtracted from the contents of the A register and the new difference is stored back in the A register. If there was a borrow into the A register on the subtraction process, both the A and the C registers are shifted left one bit each, and each are filled with a zero. The bit shifted out of the C register is concatenated with the previous code bit to form the compacted data.

Figure 10:
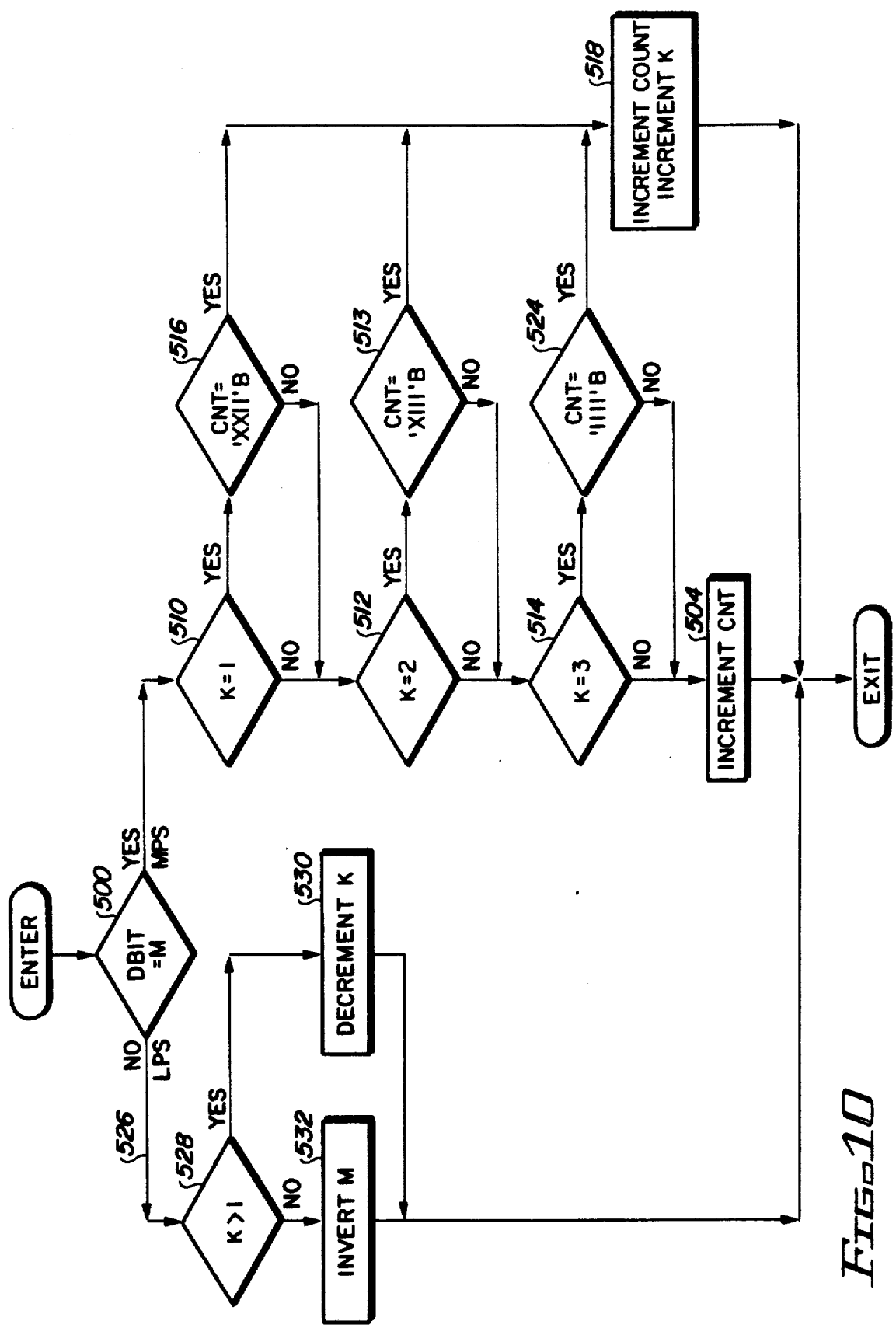
FIG. 10 shows a flow chart of the probability calculation based on the statistics tables of FIG. 3.

Since the bits shifted out of the C register is a sum of the probabilities, the carry out of the C register has to be propagated for the entire sum. It is not practical to store the entire sum in the encoder, and so the carry out propagation has to controlled, such that the code already sent out of the encoder does not need to have the carry propagated through the output. This is accomplished by stuffing bits. The sum coming out of the C register is concatenated into eight bit bytes and sent out of the encoder. Whenever a code bit with a value of all ones for the eight bits is detected, four bits of zeros are inserted after the all ones byte, to prevent a carry out of the C register from propagating to the all-ones byte. If there is a carry out of the C register, the stuffed four bits of zeros are incremented by one, thus preventing the carry out from propagating to the all ones code byte. One benefit of byte stuffing is that it allows for special character codes to be inserted in the code stream. Since an all-ones bit can be followed by only one of two combinations for the next four bits, namely 0000 and 0001, anything other than these two values can not have been generated by the encode process and so a two byte special character can be inserted. These special characters are the end of set delineators, separating the different compacted sets of data. In FIG. 10, and referring to U.S. Pat. No. 4,463,342, the probability calculation based on the statistic table are compacted. A Monte Carlo counter, CNT, is used to determine what is done to the statistics tables M and K. The Monte Carlo technique is where the decision to preform or not perform a task is based on an answer determined from a pseudo random number, rather than a deterministic approach. The CNT counter is a four bit binary UP counter. The CNT counter is reset to zeros in the initialization step of FIG. 4. The first step, as shown in block 500 of FIG. 10, is to determine if the most probable symbol MPS, or the least probable symbol LPS was processed. The MPS is when the DBIT and the M statistic are equal. The LPS is determined if they are not equal. If the LPS was processed, the guess was wrong, and the probability value of the guessed value occurring should be immediately reduced. If K is already 1, checked in block 528, then the statistics M is inverted, block 532, so that now the opposite value is saved for the guessed value. If an MPS as processed, the guess was correct and the probability value of this guessed value occurring should be increased, but not always, since increasing always leads to the maximum value of K too quickly and the penalty for guessing wrong would be much higher. Therefore, the Monte Carlo counter is used to increment K randomly. If K is equal is 1, decision block 510, and the two low ordered bits of the CNT counter are ones, block 516, then K is incremented block 518. If the K statistics value is 2 and the three low ordered bits of the counter CNT are ones block 513, then K is incremented block 518. If the statistics K is 3, block 514, and all four bits of the CNT counter are one, block 524, then the value K is incremented. If K is equal to four, then it has already at its maximum and stays there. Regardless of the value of K, for an MPS, the CNT counter is incremented, blocks 504 and 518.

Figure 12:
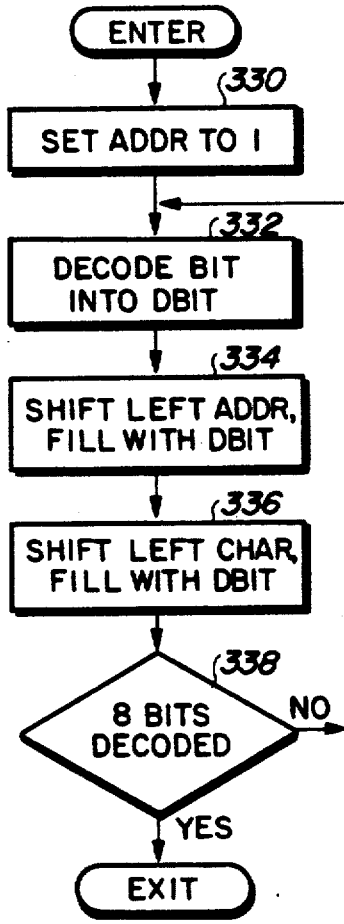
FIGS. 11 to 15 show the flow of the processing for the decoder of FIG. 3.
Figure 13:
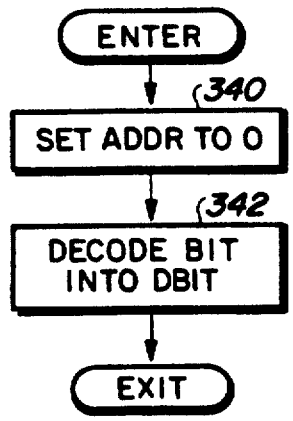

FIGS. 11 through 15 describe the flow of processing for the decode process. FIG. 11 shows the flow chart for the overall decode process for a set of data sent to the channel adapters. A set of data is 512 bytes except for the last set or remainder for the preferred embodiment. For each set of data, the decoder 124 of FIG. 3, for instance, is first initialized to a known state. Note that the statistics table is not initialized for each set of data, rather it is initialized only for each channel stream of record. The RUNCHAR register is initialized and the run MODE indication is reset at the beginning of each set of data. The C register of the decoder is loaded with the foremost significant bits of the first byte of the compacted data. The decode process decodes a bit at a time in the non-run mode. Eight bits are assembled in a byte and sent as a byte of channel data. For the run mode, the repeated byte is sent out as a byte of channel data, the process continues until all compacted data for that set of data is used and all of the bits of a set of data is decoded. If the run mode is set as shown in block 308, the YES line is taken to the decode run event of block 322. The decode run event, shown in FIG. 13, is processed and a value returned in the DBIT register. If the DBIT is one, then a repeated bit was encoded in the run mode, so the RUNCHAR is copied to the CHAR register and sent out as shown in block 314. If the DBIT is zero, then the decode character block 310, shown in FIG. 12, is processed to decode a byte of data into the CHAR register and then send the byte out. Then the run mode determination is made. If the RUNCHAR register is equal to the CHAR register, as shown block 316, the YES line is taken to set the run mode as shown in block 238. If the RUNCHAR is not equal to the CHAR, then the run mode is reset and the CHAR register is copied to the RUNCHAR register. The process continues until all the compacted data is used and all of the bytes of a set of channel data are decompacted.

The decode character process of block 310, shown in FIG. 11, is shown in FIG. 12. When the bytes are not repeated, for instance, the NO line was taken from block 308, showing that the run mode is not continued, see FIG. 11, the address ADDR at which the statistics are fetched for the first bit, is set to one. In the non-run mode, each bit is decoded by the decode character process shown in FIG. 12. For each of the eight bits of a byte to be decoded, the statistics are fetched, a bit is decoded by the decode process shown in FIG. 14, and the updated statistics are stored back in the statistic tables. The address at which the statistic are fetched for the first bit, is set to one, as shown in block 330. The decode bit is placed into the DBIT register as shown in 332. The first bit decoded in the DBIT register is stored at the most significant bit of the CHAR register. For decoding the next bit, the new statistic table address is generated by shifting the address ADDR left one bit, while filling that bit with the DBIT, as shown in block 334. The next bit decoded is stored at the next most significant bit of the CHAR register. This is done by shifting the left character of the CHAR register and filling the register with the DBIT as shown in block 336. The above process is repeated eight times to decode all of the bits into the CHAR register, as shown in the decision block 338.

The decode run event of block 322, in FIG. 11, is shown in FIG. 13. Address zero of the statistic table is used for the run mode, therefore, the address ADDR is set to zero, as shown in block 340 of FIG. 13. The decoded bit is then placed into the DBIT register and the decode bit is executed to decode the run event as shown in block 342.

Figure 14:
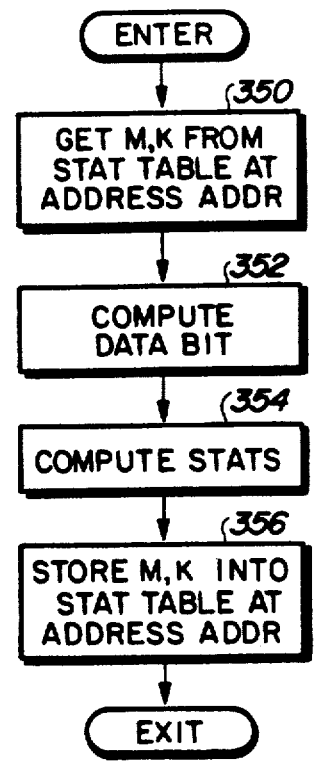

The decode bit process of block 332, of FIG. 12, is shown in FIG. 14. The statistics M and K are fetched from the statistic tables at the address specified by the ADDR signal as shown in block 350. The statistics M is a one bit value indicating the guess value and the statistics K is a two bit probability value. The statistics K can be a number from one to four. The statistics M and K are used to decode a bit using the process in the compute data bit shown in FIG. 15. In the compute data bit process of block 352, a bit is decoded and stored into the DBIT register. Then the statistics are updated as shown in block 354, to adapt the statistics to the data being decoded. This is done in the compute statistics process shown in FIG. 10. After the new statistics are computed in the statistics M and K, the statistics M and K are stored back into the statistics tables at the address specified by the ADDR signal as shown in block 356.

Figure 15:
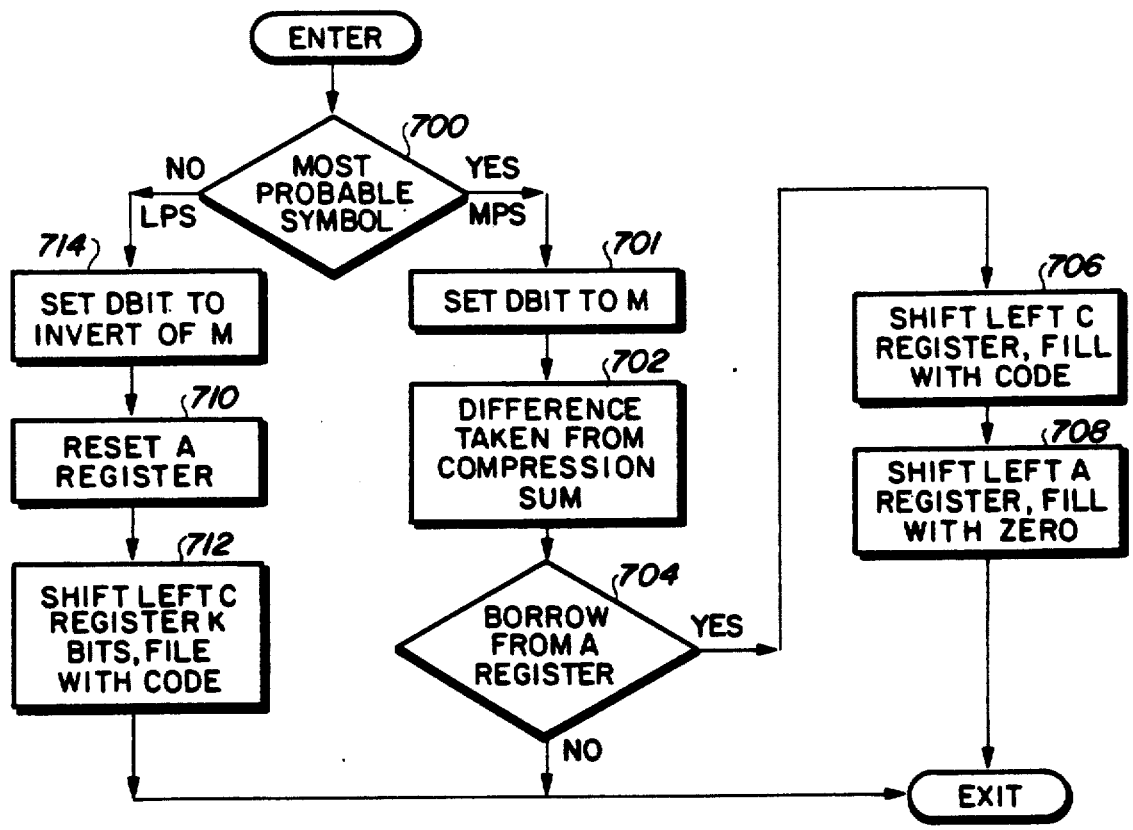

Referring to FIG. 15, the compute data bit process of block 352 in FIG. 14 is shown. The decoding processes uses the same type of A and C registers as the encoding process. The A register is the normalization register and is used the same way in the encoding process. The C register is the code register. In the preferred embodiment, both the A and the C registers have four bits each. In the initialization step of FIG. 8 for the decode cycle, both the A and the C registers are initialized to zero. The first four bits of the compacted data are then shifted into the C register. The first step shown in block 700 of FIG. 15 for the computation of the data bit is to determine whether a most probable symbol (MPS) or a least probable symbol (LPS) was encoded. A trial subtraction is preformed on the C register to determine whether the MPS or the LPS was encoded. The probability factor PF is generated from the statistic K. The PF is a four bit value that is used to perform arithmetic operations on the A and C registers. The probability factor PF can be translated from the statistics K, in the same manner as for the compute code process for FIG. 9. The PF is subtracted from the contents of the C register, and if a borrow into the C register is required, then an LPS must have been encoded, otherwise, an MPS was encoded. For an LPS from block 700, the A register is reset to zeros as shown in block 710, and C register is shifted left K times as shown in block 712. The bits coming out of the C register are discarded. The C register is filled with compacted data. Since it has been determined that an LPS has occurred, the process must have guessed wrong on the encode process, the DBIT is set to the invert value of M, as shown in block 714. For an MPS, the probability factor PF is subtracted from the contents of the C register, as shown in block 702. The new four bit difference in stored back into the C register. Also, the PF is subtracted from the contents of the A register and the new difference is stored back in the A register. If there was a borrow into the A register on the subtraction process, as shown in block 704, both the A and C registers are shifted left one bit each, as shown in blocks 706 and 708. The A register is filled with a zero and the C register is filled with a bit of the compacted data. The bit shifted out of the C register is discarded and, since an MPS has been determined, that is, the process must have guessed right on the encode process, the DBIT register is set to the value M as shown in block 701.

When the compacted data is shifted into the C register, the stuffed bits for preventing carry out must be removed, see the compute code process of FIG. 6. The stuffed bits are indentified by an all ones byte followed by the four most significant bits of the next code byte, being all zeros or 0001. If the four bits following the all ones byte are all zeros, then no action if taken and the four zero bits are simply discarded, i.e., not shifted into the C register. If the four bits following the all ones byte are 0001, then the contents of the C register are incremented by one and stored back into the C register. Also, the four bits 0001, are discarded, i.e. not shifted into the C register. If the four bits following the all ones byte are not all zeros and not 0001, then the all ones byte and the following byte are special characters are the end of set characters or the end of record characters, delineated between the sets or identifying the end of the record. When the end of set or end of record characters are encountered in the code stream, the decoding process continues until all of the data bits are decoded and the C register contents are all zeros, since this was the starting condition on the encode process.

The decompaction or decoding sequence is the most time-critical for the channel speed. The bit of data at the I-TH level of the tree has to be decoded in order to calculate the tree address needed to decode the bit at the next highest tree level. For a simple overlap, where the statistics table access time is equal to the decoded cycle time, two adjacent statistic locations are fetched, one for each possible result of the I-TH level bit of data. When the lower order address bit becomes known, such lower order bits become control signals which select and route the required statistics to the compaction unit. Simultaneously, the statistics adaptive process operates on the statistics and replaces it on the appropriate data register. The data register is then rewritten to the statistics table. The requirement for the two independent data register memory units can be solved by using a dual port memory. A dual port memory simultaneously reads and writes to two different memory address. When reading at one tree level and writing to another tree level, the addresses of the levels are guaranteed to be different. Therefore, the statistics table is never updated while it is being read.

For a more complete description of the process flow used in the compaction unit according to the present invention, reference is made to U.S. Pat. Nos. 4,286,256, 4,463,342 and 4,467,317. All of these patents are assigned to the assignee of the present invention. The compaction unit according to the present invention is a modified version shown in these three patents. The modification mainly is that two statistical tables are included for each encode and decode section and the duplication of the statistic tables permits the use of common hardware, that is, one encoder or decoder, while permitting a format compatible to a system with twice the throughput data rate. Less hardware means less cost.

The encode process of FIG. 4, is perhaps best understood by referring to the aforementioned U.S. Pat. No. 4,467,317. As used in the patent, the first register is register C, while the second register is register A. In the preferred embodiment, each of the registers A and C has 4 bits. Each are programmed to act as shift registers. Register C, during the encode cycle, contains the compressed data while during decode it contains the uncompressed data.

Referring to FIG. 15, the decode process is very similar to the encode process except that when the most probable symbol (MPS) is indicated in block 700, a difference is taken from the sum calculated during compression in block 702, to generate the uncompressed data. The A register control is identical as the encode cycle. The generation of a borrow in the A register causes normalization, while the lack of a borrow causes no control action to be taken. For the LPS decision from the first decision block 700, the A register is reset in block and the C register is left shifted by K bits and filled with the compressed data to be decoded rather than the zeros during the encode cycle.

While the invention has been particularly shown and described with reference to the preferred embodiment thereof, it will be understood by those skilled in the art that various changes in form and details may be made therein without departing from the spirit and scope of the invention:

What is claimed is:

1. An arithmetic binary compaction system comprising a number n of compaction processors, each compaction processor having one encoder and one decoder, with each of said encoders and decoders having m number of statistic table, each compaction processor handling an equal sized set of data for coding, wherein:
   q = number of sets of data to be coded;
   i = set number of q;
   set i is processed by compaction processor j using the statistic table k, where
      j = i modulo n, and
      k = (i divided by n) modulo m;
   and where for an N compaction processor system with M statistic tables in each compaction system, the configuration of a lesser than N number of compaction processors in a compaction system is defined by
      m is equal to or less than M, and
      n is equal to or less than N,
   with m, n, M, and N being integers greater than zero and n is the number of compaction processors used out the maximum in an N number of compaction processors in the system and m is the number of statistic tables used out of the M maximum number in each compaction processor.

2. A compaction system as defined in claim 1, wherein the equal sized set of data for coding is 512 bytes.

3. A compaction system as defined in claim 1, wherein n equals 4 and m equals 2.

4. A compaction system as defined in claim 1, wherein N equals 8 and M equals 2.

5. A compaction system as defined in claim 1, wherein N equals 8, M equals 2, n equals 4 and m equals 2.

6. A compaction system as defined in claim 1, wherein N equals 8, M equals 2, n equals 8 and m equals 1.

7. A compaction system as defined in claim 1 wherein the relationship of $N = m \times n$ is maintained for format compatibility.

8. A compaction system for compressing sets of data information comprising:
   at least one encoder for compressing the data;
   at least one decoder for decompressing the data;
   a plurality of statistic tables associated with each decoder;
   each statistic table storing a statement representative of a statistic process as its associated encoder or decoder processes all of one set of data directed to each, each statistic table operable in sequence such that each, in turn, accepts a subsequent set of data as its associated encoder or decoder processes the set of data, each statistic table operable to store statistic data from one set of data, in sequence, from first to last as the subsequent sections of data are directed to each storage device;
   whereby one statistic table associated with one decoder stores the statistics of the decompression of one set of data that was compressed through the statistic process of one statistic table associated with one encoder.

9. A compaction system as defined in claim 8, wherein the compaction system uses an arithmetic binary compression system and the storage devices store the statistics produced in the compression and decompression processed.

10. A compaction system as defined in claim 8, including four encoders and four decoders, with each encoder and each decoder includes two storage devices.

11. A compaction system as defined in claim 8, including eight encoders and eight decoders, with each encoder and each decoder includes one storage device.

12. An arithmetic binary compaction system comprising a plurality of compaction processors, each compaction processor having one encoder and one decoder, with each of said encoders and decoders having a plurality of statistic tables, each compaction processor handling an equal sized set of data for encoding, wherein:
   each of said statistic tables storing a statement representative of a statistic gathering process as their associated encoders and decoders process their sets of data and operable to store the statistics of each set of data as the subsequent sets of data are directed to their associated encoder or decoder;

whereby, one statistic table associated with one decoder stores the statistics of the decompression of one set of data that was compressed through the statistic gathering process of one statistic table associated with one encoder.

13. An arithmetic binary compaction system as defined in claim 12, wherein the equal sized sets of data contain 512 bytes.

14. An arithmetic binary compaction system as defined in claim 12, including four encoders and four decoders, with each encoder and each decoder including two statistic tables.

15. A controller for operation with a central processing unit, said controller comprising:
   at least one channel adapter adapted to interface with the central processing unit and accepting commands to control the operation of the controller for transfer of data to and from the central processing unit;
   a compaction system under control of the commands for accepting the data from said channel adapter for compaction; and
   means for transferring the data compacted by said compaction processor to a storage device;
   said compaction system including a number n of compaction processors, each compaction processor having one encoder and one decoder, with each of said encoders and decoders having m number of statistic tables, each compaction processor handling an equal sized set of data for coding, wherein:
   q = number of sets of data to be coded;
   i = set number of q;
   set i is processed by compaction processor j using the statistic table k, where
   j = i modulo n, and
   k = (i divided by n) modulo m;
   and where for an N compaction processor system with M statistic tables in each compaction system, the configuration of a lesser than N number of compaction processors in a compaction system is defined by
   m is equal to or less than M, and
   n is equal to or less than N,
   with m, n, M, and N being integers greater than zero and n is the number of compaction processors used out of the maximum in an N number of compaction processors in the system and m is the number of statistic tables used out of the M maximum number in each compaction processor.

16. A data processing system for operation with a central processing unit comprising a controller and a storage device, said controller operational to compact data received from the central processing unit under commands received from the central processing unit for storage in said storage device;
   said controller including at least one channel adapter adapted to interface with the central processing unit for transfer of the data to and from the central processing unit, a compaction system under control of the commands for accepting the data from said channel adapter for compaction, and means for transferring the data compacted by said compaction system to said storage device;
   said compaction system including a number n of compaction processors, each compaction processor having one encoder and one decoder, with each of said encoders and decoders having m number of statistic tables, each compaction processor handling an equal sized set of data for coding, wherein:
   q = number of sets of data to be coded;
   i = set number of q;
   set i is processed by compaction processor j using the statistic table k, where
   j = i modulo n, and
   k = (i divided by n) modulo m;
   and where for an N compaction processor system with M statistic tables in each compaction system, the configuration of a lesser than N number of compaction processors in a compaction system is defined by
   m is equal to or less than M, and
   n is equal to or less than N,
   with m, n, M, and N being integers greater than zero and n is the number of compaction processors used out of the maximum in an N number of compaction processors in the system and m is the number of statistic tables used out of the M maximum number in each compaction processor.

17. A data processing system as defined in claim 16 wherein said storage device is a media.

18. A data processing system as defined in claim 17 wherein said media is a magnetic tape stored in a cartridge.

19. A data processing system for operation with a central processing unit comprising a controller and a media storage system, said controller operational to compact data received from the central processing unit under commands received from the central processing unit for storage in said media storage system;
   said controller including at least one channel adapter adapted to interface with the central processing unit for transfer of the data to and from the central processing unit and a compaction system under control of the commands for accepting the data from said channel adapter for compaction, said compaction system including;
   at least one encoder for compressing the data;
   at least one decoder for decompressing the data;
   a plurality of statistic tables associated with each encoder;
   a plurality of statistic tables associated with each decoder;
   each statistic table storing a statement representative of a statistic process as its associated encoder or decoder processes all of one set of data directed to each, each statistic table operable in sequence such that each, in turn, accepts a subsequent set of data as its associated encoder or decoder processes the set of data, each statistic table operable to store statistic data from one set of data, in sequence, from first to last as the subsequent sections of data are directed to each storage device;
   whereby one statistic table associated with one decoder stores the statistics of the decompression of one set of data that was compressed through the statistic process of one statistic table associated with one encoder;
   said controller further including means for transferring the data compressed by said compaction system to said media storage system for storage and means for retrieving the compressed data from said media storage system for decompaction by said compression system.

20. A data processing system as defined in claim 19 wherein said media storage system is a magnetic tape drive.

21. A data processing system comprising:
an adapter operational to accept data;
a compaction system for accepting the data from said adapter for compaction into compacted data and including a number n of compaction processors, each compaction processor having one encoder and one decoder, with each of said encoders and decoders having m number of statistic tables, each compaction processor handling an equal sized set of data for coding, wherein:
q = number of sets of data to be coded;
i = set number of q;
set i is processed by compaction processor j using the statistic table k, where
j = i modulo n, and
k = (i divided by n) modulo m;
and where for an N compaction processor system with M statistic tables in each compaction system, the configuration of a lesser than N number of compaction processors in a compaction system is defined by
m is equal to or less than M, and
n is equal to or less than N,
with m, n, M, and N being integers greater than zero and n is the number of compaction processors used out of the maximum in an N number of compaction processors in the system and m is the number of statistic tables used out of the M maximum number in each compaction processor;
a storage device for storing the compacted data; and
means for transferring the compacted data from said compaction system to said storage device.

22. A data processing system as defined in claim 21 wherein said storage device is a media.

23. A data processing system as defined in claim 21 wherein said media is a magnetic tape stored in a cartridge.

24. A data processing system comprising:
an adapter operational to accept data;
a compaction system for accepting the data from said adapter for compaction into compacted data and including;
at least one encoder for compressing the data;
at least one decoder for decompressing the compacted data;
a plurality of statistic tables associated with each encoder;
a plurality of statistic tables associated with each decoder;
each statistic table storing a statement representative of a statistic process as its associated encoder or decoder processes all of one set of data or compacted data, respectively, directed to each, each statistic table operable in sequence such that each, in turn, accepts a subsequent set of data or compacted data as its associated encoder or decoder processes the set of data, each statistic table operable to store statistic data from one set of data, in sequence, from first to last as the subsequent sections of data or compacted data are directed to each encoder or decoder, respectively;
whereby one statistic table associated with one decoder stores the statistics of the decompression of one set of data that was compressed through the statistic process of one statistic table associated with one encoder;
a storage device for storing the compacted data;
means for transferring the data compressed by said compaction system to said storage device; and
means for retrieving the compressed data from said storage device for decompaction by said compaction system.

25. A data processing system as defined in claim 24 wherein said storage device is a magnetic tape drive.

26. A data processing system as defined in claim 24 wherein said storage device is a media.

* * * * *

UNITED STATES PATENT AND TRADEMARK OFFICE
CERTIFICATE OF CORRECTION

PATENT NO. : 5,109,226
DATED : April 28, 1992
INVENTOR(S) : N. H. MacLean, Jr., et al.

It is certified that error appears in the above—identified patent and that said Letters Patent is hereby corrected as shown below:

Column 17, line 58, claim 1, Change "table" to --tables--.

Column 18,
Claim 8   Line 32    Before "decoder" insert --encoder or--
          Line 41    Change "sections" to --sets--
          Line 42    Change "storage device" to --therein associated encoder or decoder--
Claim 9   Line 50    Change "storage devices" to --statistic tables--
Claim 10  Line 55    Change "includes two storage devices" to --including two storage tables--
Claim 11  Line 58    Change "includes one storage device" to --including one statistic table--
Column 20,
Claim 19  Line 56    Change "sections" to --sets--
          Line 57    Change "storage device" to --therein associated encoder or decoder--
Column 24,
Claim 24  Lines 22-23    Change "sections" to --sets--

Signed and Sealed this

Twenty-fourth Day of August, 1993

Attest:

BRUCE LEHMAN

Attesting Officer           Commissioner of Patents and Trademarks